(12) United States Patent
Takata

(10) Patent No.: US 6,866,524 B2
(45) Date of Patent: Mar. 15, 2005

(54) CONNECTOR MOUNTING STRUCTURE AND CONNECTOR MOUNTING METHOD

(75) Inventor: Kensaku Takata, Nagoya (JP)

(73) Assignees: Autoneworks Technologies, Ltd., Mie (JP); Sumitomo Wiring Systems, Ltd., Mie (JP); Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/724,642

(22) Filed: Dec. 2, 2003

(65) Prior Publication Data

US 2004/0121632 A1 Jun. 24, 2004

(30) Foreign Application Priority Data

Dec. 24, 2002 (JP) ........................................ 2002-372038

(51) Int. Cl.[7] ............................................. H01R 12/00
(52) U.S. Cl. ............................. 439/83; 439/79; 439/573
(58) Field of Search ...................... 439/79–83, 570–573

(56) References Cited

U.S. PATENT DOCUMENTS

| | | | | |
|---|---|---|---|---|
| 4,802,860 A | * | 2/1989 | Kikuta | 439/79 |
| 5,380,221 A | * | 1/1995 | Grabbe | 439/573 |
| 5,466,171 A | * | 11/1995 | Bixler et al. | 439/378 |
| 5,626,482 A | * | 5/1997 | Chan et al. | 439/74 |
| 5,746,622 A | * | 5/1998 | Consoli et al. | 439/521 |
| 6,293,818 B1 | * | 9/2001 | Kim et al. | 439/495 |
| 6,793,501 B1 | * | 9/2004 | Leeman et al. | 439/63 |

FOREIGN PATENT DOCUMENTS

| | | |
|---|---|---|
| JP | U 5-25680 | 4/1993 |
| JP | U 6-60066 | 8/1994 |

* cited by examiner

*Primary Examiner*—Truc Nguyen
(74) *Attorney, Agent, or Firm*—Oliff & Berridge, PLC

(57) ABSTRACT

In a mounting structure, a housing is supported while being raised from a printed circuit board by first molten solders provided between the housing and the printed circuit board, the supported housing is positioned such that terminals come to be located in the centers of lands by a self-alignment effect of second molten solders provided between the terminals and the lands and is fastened onto the printed circuit board by screws and the like with the first and second molten solders naturally cooled. The connector mounting structure is inexpensive and has a good durability and enables the miniaturization of a connector and a narrow arrangement of terminals.

12 Claims, 4 Drawing Sheets

CONNECTOR MOUNTING STRUCTURE AND CONNECTOR MOUNTING METHOD

BACKGROUND OF THE INVENTION

The present invention relates to a connector mounting structure and a connector mounting method used for electrical connection of terminals and a circuit board using a surface-mounting technology, and is particularly suitable for connectors mounted in a vehicle such as an automotive vehicle.

FIG. 3 is an exploded perspective view showing a prior art mounting structure for a surface-mounted connector, and FIG. 4 is an exploded perspective view showing another prior art mounting structure for a surface-mounted connector. It should be noted that no repeated description is given for elements common in FIGS. 3 and 4 by identifying them by the same reference numerals.

As shown in FIGS. 3 and 4, leading ends 21 of terminals 20 extending from a housing 11 are connected with lands 34 provided on an outer surface 33 of a board main body 31 of a printed circuit board 30 in conformity with the leading ends 21 by means of the so-called reflow soldering (40 in FIG. 3 identifies these soldered portions). Mounting structures 1A, 1B for the so-called surface-mounted connectors 10 for establishing the electrical connection of the terminals 20 and the lands 34 in this way have been known.

Since none of the terminals 20 of the surface-mounted connectors 10 is inserted into the board main body 31 of the printed circuit board 30 in both structures 1A, 1B, there are merits of enabling the terminals 20 to be arranged at narrow intervals and accordingly enabling the connector to be miniaturized. Thus, these mounting structures have been widely used in recent years.

However, in such a surface-mounted connector 10, an unnecessary force may act on the soldered portions 40 to peel them off when a mating connector (not shown) is inserted or withdrawn. Therefore, it is preferable to firmly fasten the housing 11 to the printed circuit board 30. On the other hand, the housing 11 of the surface-mounted connector 10 cannot be directly soldered to the printed circuit board 30 since being normally made of an insulating material such as a synthetic resin.

As a method of fastening such a surface-mounted connector 10 to the printed circuit board 30, there has been known a method according to which metallic plates 70 are attached at least to a bottom surface 14 of the housing 11 of the surface-mounted connector 10 and connected with metallic pads 90 provided on the outer surface 33 of the board main body 31 of the printed circuit board 30 by means of the so-called reflow soldering (90 in FIG. 3 identifies these soldered portions), thereby fastening the housing 1 to the printed circuit board 30 (see, for example, Japanese Unexamined Utility Model Publication No. H6-60066). Although the shape of the metallic plates 70 in FIG. 3 differs depending on a method of mounting the metallic plates 70 to the housing 11 in this publication, the flat metallic plates are shown here in order to simplify the description.

There is also known a method according to which screws 60 inserted through through holes 32 formed in the board main body 31 of the printed circuit board 30 are engaged with internally threaded holes 13 formed in left and right board mounting portions 12 of the housing 11 to fasten the housing 11 to the printed circuit board 30, for example, as in the structure 1B of FIG. 4 (see, for example, Japanese Unexamined Utility Model Publication No. H5-25680).

However, the structure 1A disclosed in the former publication leads to increased production costs since the metallic plates 70 are required extra. Further, fastening forces of the soldered portions 90 for firmly fastening the housing 11 of the surface-mounted connector 10 to the printed circuit board 30 may become insufficient with the passage of time. Therefore, there has been a durability problem of the surface-mounted connector 10 in such an application where vibrations and impacts are exerted particularly in a high-temperature environment such as in an automotive vehicle.

On the other hand, the structure 1B disclosed in the latter publication requires the high-precision production of the surface-mounted connector 10 and the printed circuit board 30 to position the housing 11 of the surface-mounted connector 10 on the printed circuit board 30 although being free from the above problem. Thus, productivity is reduced to lead to increased production costs.

In order to ensure a sufficient productivity, it is necessary to facilitate the positioning, which further requires a complicated and large-sized positioning structure or the like (although not shown in FIG. 4, such a positioning structure as to form recesses in the housing and accommodate nuts corresponding to the fastening screws in the recess later is disclosed, for example, in the latter publication). In this respect as well, production costs will be increased.

The complicated and large-sized positioning structure particularly hinders the miniaturization of the connector and the narrow arrangement of the terminals, whereby the above-mentioned original merits of the surface-mounted connector 10 cannot be employed.

If the above prior arts are simply combined, metallic plates are required extra, which leads not only to increased production costs, but also to a large problem in performance.

Specifically, a solder molten by reflowing (hereinafter, "molten solder") generally displays a so-called self-alignment effect of automatically centering a metallic object placed on the molten solder by the action of surface tension, and this self-alignment effect is known to be proportional to the surface area of the molten solder.

Since the surface areas of the molten solders provided between the terminals and the lands are nonnegligibly large as compared to the surface areas of the molten solders provided between the metallic plates and the metallic pads, the self-alignment effect brought about by the surface tension of the molten solders provided between the terminals and the lands is hindered by the self-alignment effect brought about by the surface tension of the molten solders provided between the metallic plates and the metallic pads.

Accordingly, the operation of positioning the connector housing on the circuit board becomes more difficult only by simply combining the prior arts. For example, even if the housing is positioned on the circuit board such that the terminals are precisely placed on the lads, the terminals automatically move out of the lands by the self-alignment effect brought about by the surface tension of the molten solders provided between the metallic plates and the metallic pads. Thus, it becomes more difficult to fasten the housing at a specified position on the circuit board using, for example, screws.

SUMMARY OF THE INVENTION

It is an object of the present invention to provide a connector mounting structure and connector mounting method which are free from the problems residing in the prior art.

It is another object of the present invention to provide a connector mounting structure and a connector mounting method which are inexpensive and have a good durability and enable the miniaturization of a connector and have a narrow arrangement of terminals.

According to an aspect of the present invention, for electrical connection between a connector and a circuit board, terminals extending from a housing of the connector is electrically connected with lands on the circuit board by supporting the housing while raising it from the circuit board by a first molten solder provided between the housing and the circuit board; positioning the supported housing such that the terminal come to be located in the center of the land by the action of surface tension of a second molten solder provided between the terminal and the land; and mechanically fastening the positioned housing onto the circuit board with the first and second molten solders solidified by cooling.

These and other objects, features and advantages of the present invention will become more apparent upon a reading of the following detailed description and accompanying drawings.

DETAILED DESCRIPTION OF THE PREFERRED EMBODIMENTS OF THE PRESENT INVENTION

Figure 1:
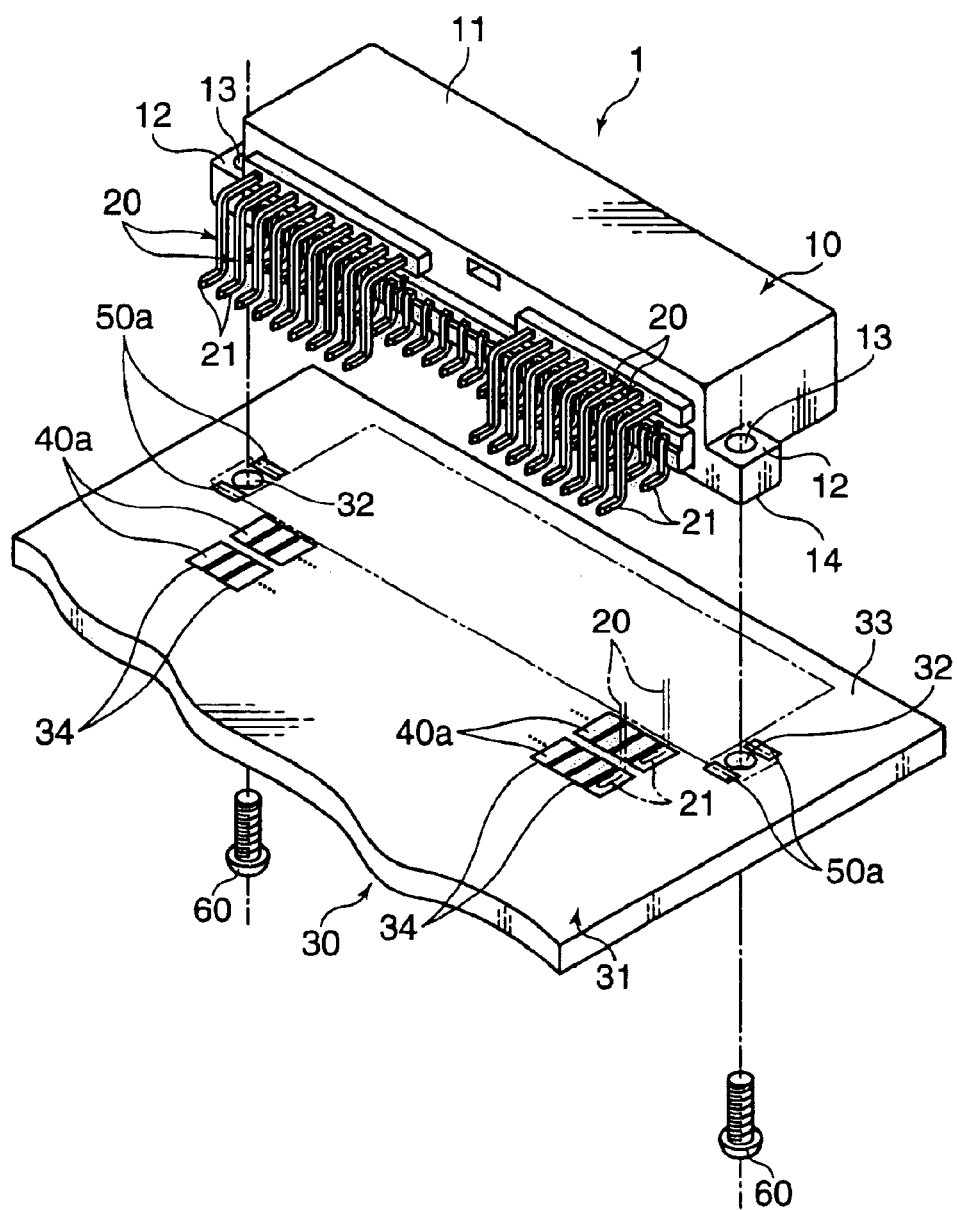
FIG. 1 is an exploded perspective view showing a mounting structure for a surface-mounted connector according to an embodiment of the invention.
Figure 2:
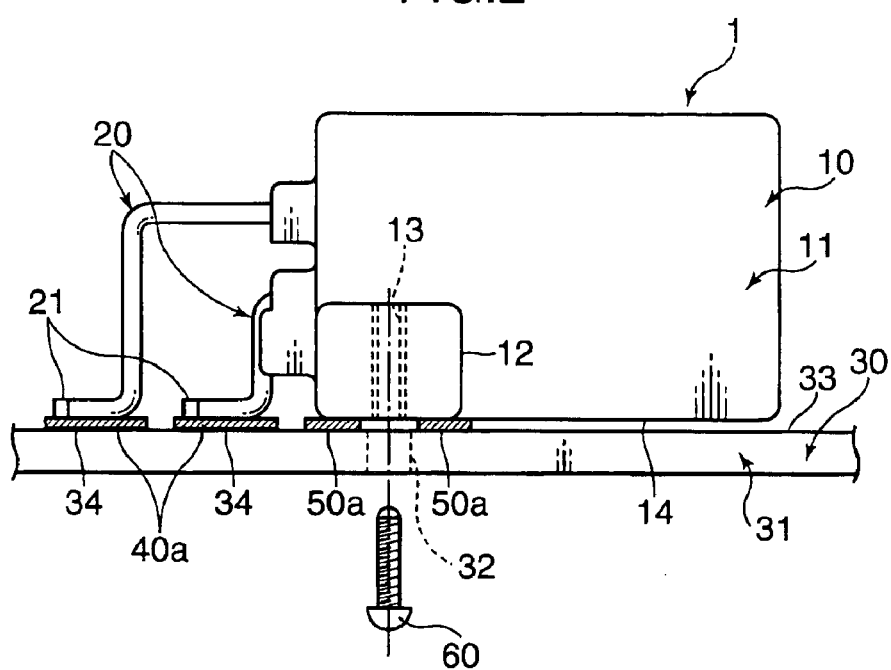
FIG. 2 is a side view showing a mounted state for the surface-mounted connector on a printed circuit board.
Figure 3:
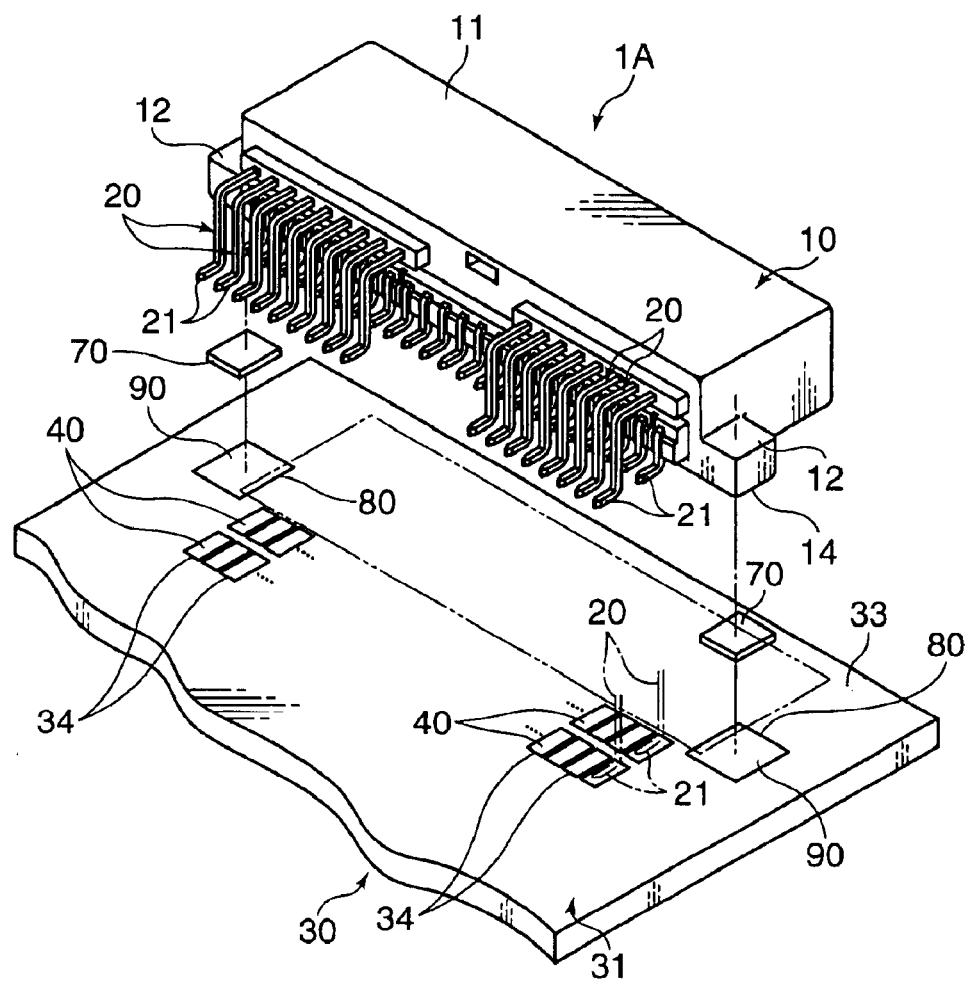
FIG. 3 is an exploded perspective view showing a prior art mounting structure for a surface-mounted connector.
Figure 4:
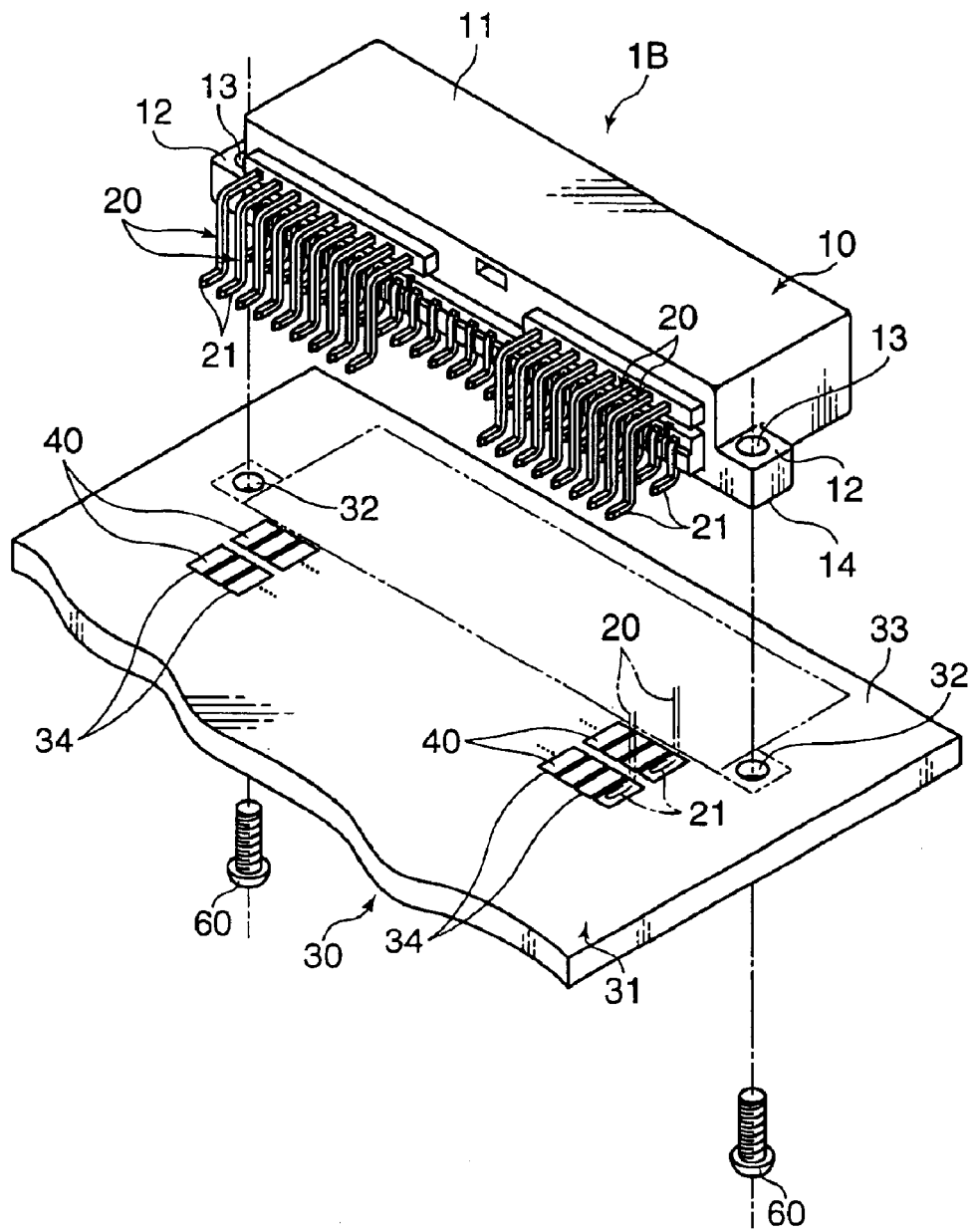
FIG. 4 is an exploded perspective view showing another prior art mounting structure for a surface-mounted connector.

A preferred embodiment of the present invention will be described with respect to a mounting structure for a surface-mounted connector to be installed in a vehicle such as an automotive vehicle as an example. Referring to FIGS. 1 and 2, in a mounting structure 1, a surface-mounted connector 10 is provided with a housing 11 made of an insulating material such as a synthetic resin and a plurality of metallic pin-shaped terminals 20 extending in parallel from the housing 11. This housing 11 is arranged on a printed circuit board 30. The respective terminals 20 are connected with corresponding lands 34 by means of the so-called reflow soldering to establish an electrical connection between the terminals 20 and the lands 34.

The housing 11 is substantially in the form of a rectangular parallelepiped transversely long in FIG. 1, and internally threaded holes 13 engageable with screws 60 are formed substantially in the middles of board mounting portions 12. The internally threaded holes 13 and the screws 60 form one example of a fastener.

In FIG. 1, each terminal 20 is bent down at right angles after horizontally projecting from the housing 11, and the leading end thereof is bent again to extend in a direction parallel with the projecting direction thereof, whereby the terminal 20 is S-shaped in side view. Seventeen terminals 20 and twenty three terminals 20 are arranged side by side along the longitudinal direction of the housing 11 in an upper row and a lower row in such a manner as not to interfere with each other, and the terminals 20 in the upper row are located right above the corresponding ones in the lower row. The shape and the number of the respective terminals 20 differ depending on the type and size of the surface-mounted connector 10.

The printed circuit board 30 includes a board main body 31 in the form of a thin plate, and the metallic lands 34 formed at positions of an outer surface 33 of the board main body 31 corresponding to leading ends 21 of the respective terminals 20 in order to be brought into contact with the leading ends 21. An area of each land 34 is set slightly larger than a bottom area of each corresponding leading end 21. A solder paste 40a is uniformly applied to the outer surfaces of these lands 34, for example, by screen printing.

The pieces of the solder paste 40a are reflowed by far infrared rays or hot air, thereby becoming second molten solders (identified by 40a in FIGS. 1 and 2) to be located between the terminals 20 and the lands 34. Since soldering operation is speeded up by such reflow soldering, the productivity can be improved.

Further, a solder paste 50a is applied at positions (for example, two left and right positions near a boundary of each board mounting portion 12) of the outer surface 33 of the printed circuit board 30 corresponding to the internally threaded holes 13 of the respective board mounting portions 12 by, e.g. screen printing in order to bring a bottom surface 14 of the housing 11 into contact with the outer surface 33. The solder paste 50a is applied only to these positions to avoid a deterioration of a reflowing operability of the solder paste 50a in consideration of a poor heat transfer of the housing 11 unlike the terminals 20. It is also because, when the housing 11 is fastened by engaging the screws 60 with the internally threaded holes 13, the applied positions of the solder paste 50a are preferably located as close to the fastening portions as possible to hold the housing 11 in a stable posture.

The applied pieces of the solder paste 50a are reflowed by far infrared rays or hot air, thereby becoming first molten solders (identified by 50a in FIGS. 1 and 2) to be located between the housing 11 and the printed circuit board 30. Since such reflow soldering is applied simultaneously with the reflow soldering of the solder paste 40a, the soldering operation is more speeded up to further improve the operability.

The surface-mounted connector 10 is mounted on the printed circuit board 30, for example, as follows. Description is made with reference to FIGS. 1 and 2.

First, as shown in FIG. 1, the solder paste is uniformly applied to the aforementioned positions of the outer surface 33 of the board main body 31 of the printed circuit board 30 by, e.g. screen printing. With the solder paste 50a applied, the surface-mounted connector 10 is placed on the printed circuit board 30 as shown in FIG. 2. The applied pieces of the solder paste are reflowed by far infrared rays or hot air to be molten, thereby becoming the first molten solders located between the housing 11 and the printed circuit board 30. The housing 11 of the surface-mounted connector 10 is supported while being raised from the printed circuit board 30 by this first molten solders (first step).

Simultaneously with the first step, the solder paste is uniformly applied to the lands 34 of the board main body 31 of the printed circuit board 30. The applied pieces of the solder paste are reflowed by far infrared rays or hot air to be molten, thereby becoming the second molten solders 40a located between the terminals 20 and the lands 34. The housing 11 of the surface-mounted connector 10 is slidably supported while being raised from the printed circuit board 30 in a well-balanced manner with respect to forward and backward directions and transverse direction by the first and second molten solders.

A self-alignment effect by the first molten solders does not work on the supported housing 11 since the first molten solders are located between the nonmetallic materials, and only a self-alignment effect by the second molten solders works on the housing 11 since the second molten solders are located between the metallic materials. Thus, the terminals 20 are automatically and precisely aligned and positioned with the centers of the terminals 20 (second step).

After the first and second molten soldered are, for example, naturally cooled, the screws 60 inserted through the through holes 32 formed in the board main body 31 of the printed circuit board 30 are engaged with the internally threaded holes 13 of the left and right board mounting portion 12 of the positioned housing 11, whereby the housing 11 is securely fastened onto the printed circuit board 30.

Since the surface-mounted connector 10 thus mounted does not require any metallic plate unlike the prior art, the production costs can be accordingly reduced. Further, the fastening force acting between the housing 11 of the surface-mounted connector 10 and the printed circuit board 30 can be ensured by a mechanical means such as the screws 60 and the internally threaded holes 13. Accordingly, the fastening force does not become insufficient with the passage of time unlike the one given by soldering as in the prior art, and the durability problem can be eliminated in such an application where vibrations and impacts are exerted, particularly, in a high-temperature environment such as in an automotive vehicle.

Since the surface-mounted connector 10 and the printed circuit board 30 need to be highly precisely produced for positioning unlike the prior art, the productivity can be improved. Further, since no complicated large-sized construction is necessary for positioning, production costs can be reduced in this respect as well. Therefore, the merits of the surface-mounted connector to enable, particularly, the miniaturization and the narrower arrangement of the terminals can be fully employed.

Although the screws 60 and the internally threaded holes 13 are used as a fastener in the foregoing embodiment, another mechanical fastening method such as a clamping structure may be used.

Although the solder paste is applied at two positions near the boundary of each of the left and right board mounting portions 12 of the housing 11 to become the first molten solders in the foregoing embodiment, it may be applied at one, three or more positions for each board mounting portion 12. However, these applied positions are preferably as transversely symmetrical as possible in order to ensure a good balance in transverse direction with the housing 11 raised from the printed circuit board 30.

Further, although the surface-mounted connector 10 used in a vehicle such as an automotive vehicle is described in the foregoing embodiment, the present invention is applied to surface-mounted connectors used in other applications such as household electric appliances.

As described above, an inventive connector mounting structure for electrically connecting terminals extending from a housing and lands on a circuit board by soldering the terminals to the lands, comprises: first molten solders provided between the housing and the circuit board for supporting the housing while raising it from the circuit board; second molten solders provided between the terminals and the lands for positioning the supported housing such that the terminals come to be located in the centers of the lands by the action of surface tension; and a fastener for mechanically fastening the positioned housing on the circuit board with the fist and second molten solders solidified by cooling.

With this construction, the housing is made slidable on the circuit board by being supported while being raised form the circuit board by the first molten solders provided between the housings and the circuit board. However, the self-alignment effect brought about by the action of the surface tension does not work between the housing and the circuit board. On the other hand, by positioning the housing such that the terminals come to be located in the centers of the lands by the action of the surface tension of the second molten solders provided between the terminals and the lands, the self-alignment effect brought about by the action of the surface tension is actively employed between the terminals and the lands and the terminals are automatically positioned with respect to the lands thereby. The positioned housing is fastened by the fastener for mechanically fastening the housing onto the circuit board while being precisely positioned on the circuit board with the first and second molten solders solidified by cooling. This requires no metallic plate unlike the prior art and production costs can be accordingly reduced. Further, a fastening force between the connector and the circuit board can be ensured by the mechanically fastener. Thus, unlike the case of providing the fastening force by soldering, there is no likelihood that the fastening force becomes insufficient with the passage of time and no durability problem arises even in such an application where vibrations and impacts are exerted, particularly, in a high-temperature environment such as in an automotive vehicle.

Further, since the connector and the circuit board need not be produced with high precision for positioning unlike the prior art, the productivity is better and no complicated large-sized construction is required for positioning. In this respect as well, the production costs can be reduced and the merits of the surface-mounted connector to particularly enable the miniaturization and a narrow arrangement of terminals can be fully employed.

Preferably, the first molten solders may be provided between the housing and the circuit board by reflowing a solder paste applied to the outer surface of the circuit board to be held in contact with the bottom surface of the housing. Then, the soldering operation can be speeded up to improve the productivity of the connector.

Since the housing is normally is made of a nonmetallic material poor in heat transfer in order to possess an electrically insulating property, the reflowing operability is poor depending on the applied positions of the solder paste. On the other hand, the applied positions of the solder paste are preferably as close to the fastener as possible to hold the housing in a stable posture during the fastening by the fastener. Accordingly, the solder paste is applied to such positions near the fastener as to be reflowable to the fastener. Then, the productivity of the connector can be further improved since the housing can be fastened in the stable posture while ensuring the reflowing operability.

Preferably, the second molten solders are provided between the terminals and the lands by reflowing a solder paste applied to the outer surfaces of the lands to be held in contact with the terminals. Then, the soldering operation can be speeded up to improve the productivity of the connector.

An inventive connector mounting method for electrically connecting terminals extending from a housing and lands on a circuit board by soldering the terminals to the lands, comprises: a first step of supporting the housing while raising it from the circuit board by first molten solders provided between the housing and the circuit board; a second step of positioning the supported housing such that the terminals come to be located in the centers of the lands by the action of surface tension of second molten solders provided between the terminals and the lands; and a third step of mechanically fastening the positioned housing onto the circuit board with the first and second molten solders solidified by cooling.

With this method, the housing is supported while being raised from the circuit board by the first molten solders provided between the housing and circuit board, the supported housing is positioned such that the terminals come to be located in the centers of the lands by the action of the surface tension of the second molten solders provided between the terminals and the lands, and the positioned housings is mechanically fastened onto the circuit board with the first and second molten solders solidified by cooling. Thus, the mounted connector does not require metallic plates unlike the prior art and the production costs can be accordingly reduced. Further, the fastening force acting between the connector and the circuit board does not become insufficient with the passage of time after the mounting of the connector, and no durability problem arises even in such an application where vibrations and impacts are exerted, particularly, in a high-temperature environment such as in an automotive vehicle.

Since the connector and the circuit board need not be produced with high precision for positioning during the mounting unlike the prior art, the productivity can be improved and no complicated large-sized construction is required for positioning. In this respect as well, the production costs can be reduced and the merits of the surface-mounted connector to particularly enable the miniaturization and a narrow arrangement of terminals can be fully employed.

The productivity can be improved and the production costs can be reduced. Thus, the merits of the surface-mounted connector to enable, particularly, the miniaturization and the narrower arrangement of the terminals can be fully employed.

This application is based on patent application No. 2002-372038 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A connector mounting structure for electrically connecting terminals extending from a housing with lands on a circuit board by soldering, comprising:
    a first molten solder provided between the housing and the circuit board for supporting the housing while raising it from the circuit board;
    a second molten solder provided between a terminal and a land for positioning the supported housing such that the terminal come to be located in the center of the land by the action of surface tension; and
    a fastener for mechanically fastening the positioned housing on the circuit board with the fist and second molten solders solidified by cooling.

2. A connector mounting structure according to claim 1, wherein the first molten solder is provided between the housing and the circuit board by reflowing a solder paste applied to the outer surface of the circuit board to be held in contact with the bottom surface of the housing.

3. A connector mounting structure according to claim 2, wherein the second molten solder is provided between the terminal and the land by reflowing a solder paste applied to the outer surface of the land to be held in contact with the terminal.

4. A connector mounting structure according to claim 2, wherein the solder paste is applied to such a position near the fastener as to be reflowable to the fastener.

5. A connector mounting structure according to claim 4, wherein the second molten solder is provided between the terminal and the land by reflowing a solder paste applied to the outer surface of the land to be held in contact with the terminal.

6. A connector mounting structure according to claim 1, wherein the second molten solder is provided between the terminal and the land by reflowing a solder paste applied to the outer surface of the land to be held in contact with the terminal.

7. A connector mounting method for electrically connecting terminals extending from a housing with lands on a circuit board by soldering, comprising:
    a first step of supporting the housing while raising it from the circuit board by a first molten solder provided between the housing and the circuit board;
    a second step of positioning the supported housing such that the terminal come to be located in the center of the land by the action of surface tension of a second molten solder provided between the terminal and the land; and
    a third step of mechanically fastening the positioned housing onto the circuit board with the first and second molten solders solidified by cooling.

8. A connector mounting method according to claim 7, wherein the first molten solder is provided between the housing and the circuit board by reflowing a solder paste applied to the outer surface of the circuit board to be held in contact with the bottom surface of the housing.

9. A connector mounting method according to claim 8, wherein the second molten solder is provided between the terminal and the land by reflowing a solder paste applied to the outer surface of the land to be held in contact with the terminal.

10. A connector mounting method according to claim 8, wherein the solder paste is applied to such a position near the fastener as to be reflowable to the fastener.

11. A connector mounting method according to claim 10, wherein the second molten solder is provided between the terminal and the land by reflowing a solder paste applied to the outer surface of the land to be held in contact with the terminal.

12. A connector mounting method according to claim 7, wherein the second molten solder is provided between the terminal and the land by reflowing a solder paste applied to the outer surface of the land to be held in contact with the terminal.

* * * * *

UNITED STATES PATENT AND TRADEMARK OFFICE
CERTIFICATE OF CORRECTION

PATENT NO. : 6,866,524 B2
DATED : March 15, 2005
INVENTOR(S) : Kensaku Takata

It is certified that error appears in the above-identified patent and that said Letters Patent is hereby corrected as shown below:

Title page,
Item [73], Assignees, replace "Autoneworks Technologies, Ltd., Mie (JP); Sumitomo Wiring Systems, Ltd., Mie (JP); Sumitomo Electric Industries, Ltd., Osaka (JP)" with -- Autonetworks Technologies, Ltd., Mie (JP); Sumitomo Wiring Systems, Ltd., Mie (JP); Sumitomo Electric Industries, Ltd., Osaka (JP) --

Signed and Sealed this

Fourteenth Day of June, 2005

JON W. DUDAS
*Director of the United States Patent and Trademark Office*